(12) United States Patent
Tian et al.

(10) Patent No.: US 11,430,688 B2
(45) Date of Patent: Aug. 30, 2022

(54) TWO-STAGE PIN LIFTER FOR DE-CHUCK OPERATIONS

(71) Applicant: Lam Research Corporation, Fremont, CA (US)

(72) Inventors: Siyuan Tian, Fremont, CA (US); Eric A. Pape, Acton, CA (US)

(73) Assignee: Lam Research Corporation, Fremont, CA (US)

( * ) Notice: Subject to any disclaimer, the term of this patent is extended or adjusted under 35 U.S.C. 154(b) by 305 days.

(21) Appl. No.: 16/121,229

(22) Filed: Sep. 4, 2018

(65) Prior Publication Data

US 2020/0075389 A1    Mar. 5, 2020

(51) Int. Cl.
*H01L 21/687* (2006.01)
*H01L 21/67* (2006.01)
*H01L 21/683* (2006.01)

(52) U.S. Cl.
CPC .. *H01L 21/68742* (2013.01); *H01L 21/67259* (2013.01); *H01L 21/67288* (2013.01); *H01L 21/6831* (2013.01)

(58) Field of Classification Search
CPC ......... H01L 21/68742; H01L 21/67259; H01L 21/67288; H01L 21/6831
See application file for complete search history.

(56) References Cited

U.S. PATENT DOCUMENTS 6,231,716 B1 * 5/2001 White ............... H01L 21/67748
  156/345.54
6,898,064 B1 * 5/2005 Berman ............. H01L 21/6831
  361/233
8,840,754 B2 * 9/2014 Hao .................. H01L 21/68742
  156/345.51
2004/0031338 A1 * 2/2004 Chen ................. H01L 21/67259
  73/865.9
2005/0012938 A1 * 1/2005 Chen ....................... G03F 7/707
  356/614
2005/0065634 A1 * 3/2005 Nakajima ........... H01L 21/6875
  700/213

(Continued)

FOREIGN PATENT DOCUMENTS

JP       2010258452 A    11/2010
WO   WO-2020051069 A1    3/2020

OTHER PUBLICATIONS

"International Application Serial No. PCT/US2019/048886, International Search Report dated Dec. 18, 2019", 3 pgs.

(Continued)

*Primary Examiner* — Seahee Hong
(74) *Attorney, Agent, or Firm* — Schwegman Lundberg & Woessner, P.A.

(57) ABSTRACT

Various embodiments include apparatuses to raise and lower substrates, as used in the semiconductor and allied industries, toward or away from a substrate-holding mechanism (e.g., such as an electrostatic chuck (ESC). In a specific embodiment, a substrate lift-mechanism includes a number of pins to position the substrate above a substrate-holding device. Mid-position sensors are respectively coupled to a corresponding pin. The mid-position sensors monitor an intermediate position of the corresponding pin between a maximum position and a minimum position. Other apparatuses and systems are disclosed.

19 Claims, 7 Drawing Sheets

(56) References Cited

U.S. PATENT DOCUMENTS

| | | | | |
|---|---|---|---|---|
| 2006/0238953 A1* | 10/2006 | Hanawa | ............. | H01L 21/6831 |
| | | | | 361/234 |
| 2010/0008016 A1 | 1/2010 | Onate et al. | | |
| 2010/0208409 A1 | 8/2010 | Bluck et al. | | |
| 2010/0248490 A1* | 9/2010 | McMillin | .......... | H01J 37/32788 |
| | | | | 438/716 |
| 2011/0236162 A1* | 9/2011 | Shikayama | ....... | H01L 21/68742 |
| | | | | 414/222.01 |
| 2012/0070996 A1 | 3/2012 | Hao | | |

OTHER PUBLICATIONS

"International Application Serial No. PCT/US2019/048886, Written Opinion dated Dec. 18, 2019", 5 pgs.

International Application Serial No. PCT/US2019/048886, International Preliminary Report on Patentability dated Mar. 18, 2021, 7 pgs.

\* cited by examiner

TWO-STAGE PIN LIFTER FOR DE-CHUCK OPERATIONS

TECHNICAL FIELD

The subject matter disclosed herein relates to equipment used in the semiconductor and allied industries. More specifically, the disclosed subject matter relates to removal of substrates from an electrostatic chuck (ESC) on a process tool.

BACKGROUND

Generally, various pieces of semiconductor process equipment (e.g., etch tools) use three pressure-driven pin lifters to raise and lower semiconductor substrates (e.g., silicon wafers) onto or remove from an electrostatic chuck (ESC). The ESC is known to a person of ordinary skill in the art and is commonly used in, for example, plasma-based and vacuum-based semiconductor processing. The ESC is used to mount and electrostatically "clamp" a substrate during semiconductor processing but is also used to cool or heat substrates and provide flattening of the substrate to increase uniformity of processing.

Typically, a sequence of chucking and de-chucking operations includes the operations described below. A substrate is transferred into a process chamber with an end-effector of a robotic arm. Generally, three sapphire or metal substrate-lift pins move up and receive the substrate from the robotic arm while the pins are in a raised or "up" position. After the robotic arm is retracted from the process chamber, the substrate-lift pins move to a lowered or "down" position. The pins retract to just below (e.g., typically by just tens of microns) a top surface of the ESC, thereby leaving the substrate to land on a top, ceramic surface of the ESC. The ESC begins "chucking" the substrate by applying a high voltage to electrodes that are embedded inside the ceramic surface of the ESC (for conductor coulombic ESCs, both positive and negative voltages are applied). Once the process is completed, the high voltage applied to the ESC is reset to zero to remove all charges. The pins raise to the "up" position to lift the substrate and the robotic arm removes the substrate from the process chamber.

However, electric charges are frequently trapped at or near the ESC surface, thereby creating residual chucking forces between the substrate and the ESC. When the pins are raised, during a substrate de-chucking operation, the residual chucking forces may cause unwanted substrate movement, such as bending, tilting, jumping, lateral sliding, and other movements that are potentially deleterious to semiconductor processing operations. In a worst-case scenario, the substrate may break while being separated from the ESC.

The information described in this section is provided to offer the skilled artisan a context for the following disclosed subject matter and should not be considered as admitted prior art.

DETAILED DESCRIPTION

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

In various contemporaneous designs, several factors contribute to a wafer offset, also known as a dynamic alignment (DA) offset and discussed in more detail with reference to FIGS. 1C and 2, below. These factors include:

1. While the wafer lift pins are moving to either a raised wafer position ("up" position) or lowered position ("down" position), a maximum acceleration of the lift pins can be as large as one "G" (9.8 m/sec$^2$). This large acceleration can result in the DA offset.
2. Wafer lift pins have no intermediate control state to indicate a motion of the lift pin except just an "up" state and a "down" state. Consequently, a pressure inside the pin lifter mechanism is either at atmospheric pressure or at a pressure of the system used to pressurize the lift pin mechanism (a pressure of the clean, dry air (CDA) system).
3, Wafer lift pins have, at most, only two sensors. The sensors can detect whether the pin lifters are in an "up" position or a "down" position. There is no means to determine if a lift pin is in an intermediate position. Consequently, there is no way to determine if a wafer has been successfully de-chucked or if the wafer is broken.
4. Since there are only two sensors, there is no means to determine if a lift pin is either sticking or if the lift pin is moving more slowly than expected.

Figure 1A:
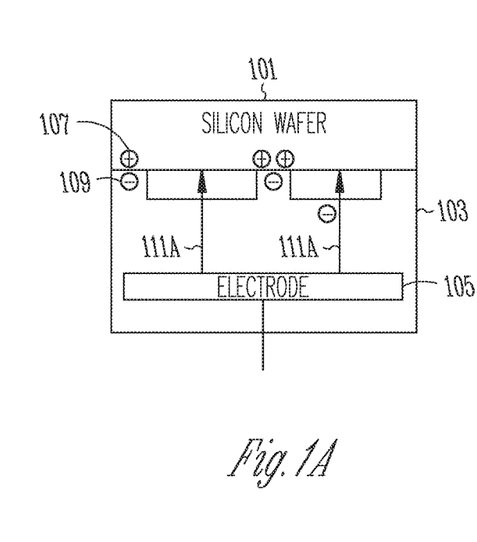
FIGS. 1A-1C show examples of chucking and de-chucking operations and a resultant substrate lateral movement, with reference to an electrostatic chuck (ESC), due to charge remaining on at least one of the substrate or the ESC during the de-chucking operation.

With reference to a chucking operation of FIG. 1A, a silicon wafer 101 is placed on an electrostatic chuck (ESC) 103. The ESC 103 has at least one electrode 105, to apply a voltage to the ESC 103, and multiple substrate lifting mechanisms (pins) in a lowered position 111A. In the lowered position 111A, the pins are generally tens of microns below an uppermost surface of the ESC 103. However, an exact distance below the uppermost surface has no effect on the performance or functioning of the disclosed subject matter provided that the silicon wafer 101 is in contact, or near contact, with the uppermost surface of the ESC 103 during a chucking operation. A person of ordinary skill in the art will recognize, based upon reading and understanding the disclosure provided herein, that the disclosed subject matter may apply equally to any type of substrate used in the semiconductor and allied industries. Therefore, the substrate need not be limited to only silicon wafers. However, the term "silicon wafer" will be used herein merely for clarity to describe various aspect of the disclosed subject matter.

A high voltage is applied to the electrode 105, which in turn delivers the high voltage to the ESC 103. The applied high voltage creates opposite sign charges between the silicon wafer 101 and the ESC 103. In this example, a negative charge 109 is formed on the ESC 103 and a positive charge 107 is formed on a surface of the silicon wafer 101 that is proximate to the ESC 103 (wafer charges redistribute primarily on a lowermost portion of the silicon wafer 101 proximate to the ESC 103). Consequently, the applied voltage from the electrode 105 creates an electrostatic force holding the silicon wafer 101 onto the ESC 103.

In a typical process flow, after the silicon wafer 101 is chucked by the electrostatic force to the ESC 103, helium gas is delivered (e.g., to increase thermal conductivity for heating and cooling of the silicon wafer 101) to the backside of the silicon wafer 101 (i.e., the side of the wafer proximate to the ESC 103) prior to the start of a desired process recipe. After the process recipe is completed, the helium gas flow stops and is then pumped out (evacuated). The high voltage of the electrode 105 is reset to zero to, ideally, remove all charges.

Figure 1B:
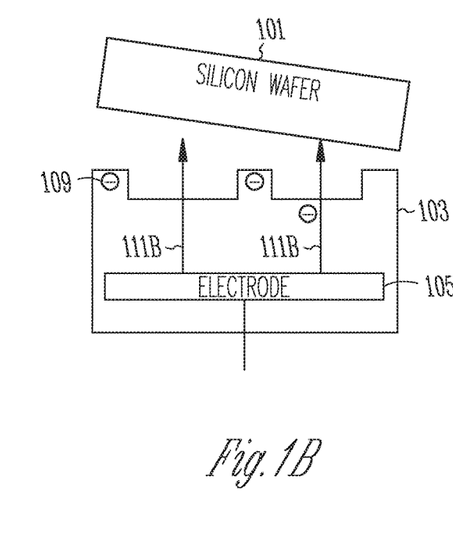
Figure 1C:
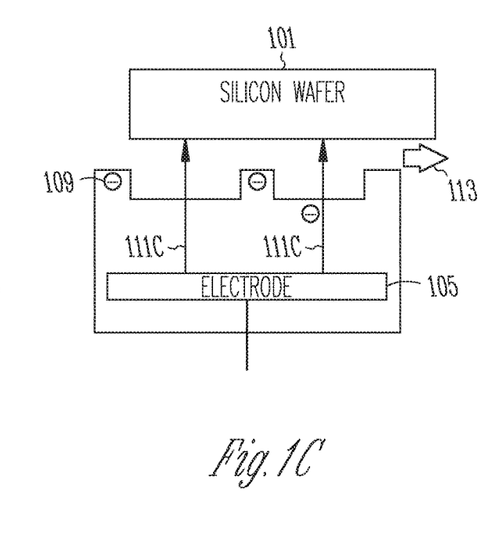

With reference now to FIG. 1B, after the helium is evacuated and the high voltage on the electrode 105 is reset to zero volts, the pins move from the lowered position 111A to a raised position 111B. In the raised position 111B, the pins lift the silicon wafer 101 to a fixed "up" position. In the up position, the robotic arm can move back into the process chamber to pick up and remove the silicon wafer 101.

However, as noted in FIG. 1B, if there is still remaining charge on the silicon wafer 101 or the ESC 103, the silicon wafer 101 may not lift properly above the ESC 103 when the pins are in the raised position 111B due to residual attractive forces, including for example, charge trapping, and migration of charges. Consequently, due to the attractive forces, the silicon wafer 101 may move laterally and/or rotationally with reference to the ESC 103 as shown in FIG. 1C. The lateral and/or rotational shift causes a dynamic-alignment (DA) offset 113. Overall, and as discussed in greater detail with regard to FIG. 2 below, dynamic alignment measures a position of the silicon wafer 101 as the silicon wafer 101 moves into or out of the process chamber. The DA offset 113 is a difference between the silicon wafer 101 before the process begins versus after the process is completed (that is, DA before process—DA after process). The DA offset 113 monitors a quality of the wafer de-chuck.

As discussed briefly above, at ESC operating-temperatures, which may be several hundred degrees Celsius, electric charge can become trapped at an uppermost surface of the ESC 103 during a wafer chucking operation. The trapped charges are also referred to as residual charges. Furthermore, various emissions from the silicon wafer 101 may also be a factor in residual forces occurring between the silicon wafer 101 and the ESC 103. These residual forces can cause unwanted wafer movement, such as bending, tilting, jumping, sliding, or even breakage of the wafer.

A specific de-chuck failure root cause can be complex, depending on process, wafer type, ESC ceramic material, ceramic temperature, process time, bias voltage, process chemistries, and other factors. For example, as is known to a person of ordinary skill in the art, there are two main types of ESC used in the semiconductor and allied industries a coulombic-type chuck and a Johnsen-Rahbek type of chuck. One significant difference between the two chuck types relates to de-chuck operations. In a coulomb-type chuck, once the high voltage on the electrode 105 is reset to zero volts, a nearly-instantaneous and large short-circuit current, flows, but decreases exponentially with a short time constant (on the order of milliseconds). However, in a Johnsen-Rahbek type of chuck, a non-exponentially decaying small current is sustained for much longer time (on the order of seconds), thereby potentially causing a much longer de-chuck time due to the time required for residual charges to dissipate.

Figure 2:
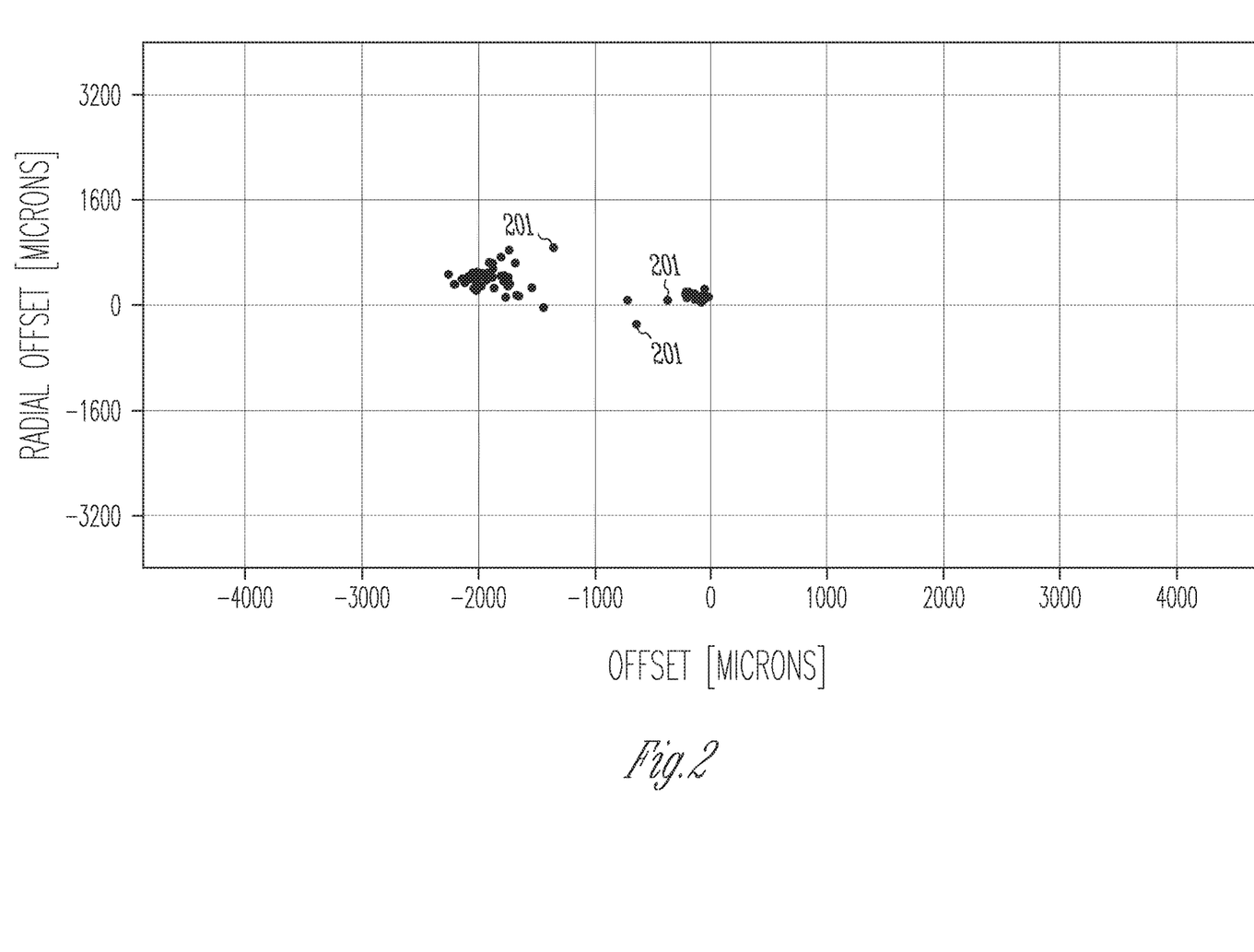
FIG. 2 shows an example graph indicating dynamic alignment offsets of a substrate.

Referring now to FIG. 2, an example graph indicating dynamic alignment offsets of a substrate is shown. The graph indicates a number of DA offset positions 201 from a wafer that has been de-chucked from a substrate-holding device (e.g., such as the ESC 103). The abscissa indicates a theta ($\square$ or rotational) offset DA from a true-zero position (as noted with regard to a center position of the ESC 103). The ordinate axis indicates a radial offset DA from the true-zero position. Consequently, if a substrate has shifted rotationally from the true-zero position (e.g., due to a twisting motion after release from the substrate-holding device), then the theta distance is measured and recorded. If the substrate has shifted radially from the true-zero position (e.g., due to a linear shift in position after release from the substrate-holding device), then the radial distance is measured and recorded. As is indicated in FIG. 2, the DA offset positions 201 indicate that, each of the respective substrates measured underwent both a theta offset as well as a radial offset.

Various types of position sensors, known independently in the art, may be used to determine a position of the substrate to prepare the graph of FIG. 2. In a specific exemplary embodiment, a laser-based reflectometer or optical camera may be used to determine both linear and rotational movements of the substrate.

Based on the description provided above, a person of ordinary skill in the art will understand that residual wafer chucking forces are frequently inevitable. Therefore, to mitigate unwanted wafer movement as discussed with reference to FIG. 2 during wafer de-chuck, and also prevent or reduce wafer breakage, one exemplary approach is to control precisely the wafer lift force at the beginning of a wafer de-chuck operation. Therefore, as disclosed herein, various embodiments of the precise wafer-lift-control mechanism (e.g., a substrate lift-mechanism) overcome forces to release the silicon wafer 101 from the ESC 103, but significantly reduce or eliminate excessive wafer deflection (or breakage) and relaxation.

Figure 3:
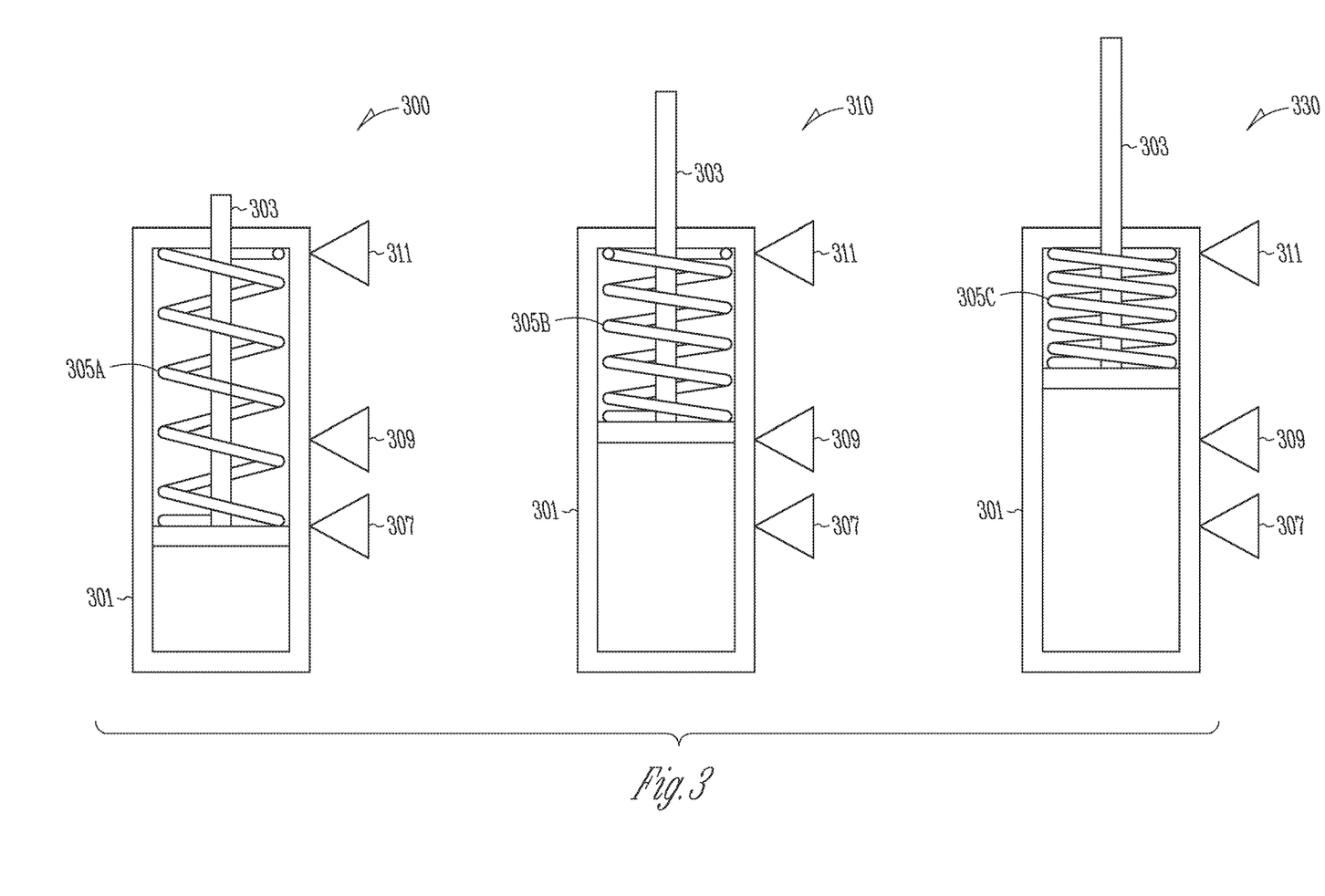
FIG. 3 shows examples of a two-stage pin lifter system.

Referring now to FIG. 3, examples of a two-stage pin lifter system are shown. In an embodiment, the two-stage pin lifter system uses three independent two-stage pin lifters (only one of which is shown in each of three different positions) to raise the silicon wafer 101 from the ESC 103 (see FIGS. 1A through 1C). Each two-stage pin lifter includes one or more integrated sensors and a continuous tuning pressure control as described in more detail, below.

Also, even though this embodiment uses three independent pin lifters, a skilled artisan will recognize that more than three pin lifters may be used in different embodiments. For example, a lift mechanism designed to raise and lower a large flat-panel display (FPD) may use four or more pins.

With reference again to FIG. 3, a two-stage pin lifter in a lowered position 300 is shown to include an actuator cylinder 301, a pneumatically-controlled pin 303, and a slightly-compressed return spring 305A. The two-stage pin lifter is also shown to include a lowered-position sensor 307, a mid-position sensor 309, and a raised-position sensor 311. With continued reference to FIG. 3, a two-stage pin lifter in a mid-position 310 has a partially-compressed return spring 305B, and a two-stage pin lifter in a raised-position 330 has a fully-compressed return spring 305C.

The skilled artisan will recognize that the two-stage pin lifter is shown schematically merely to highlight certain features of the two-stage pin lifter. A variety of other configurations in accordance with this exemplary embodiment are also possible. For example, rather than the return spring 305A-305C, the two-stage pin lifter may incorporate other types of mechanical elastic-return mechanisms. Instead of or in addition to a mechanical elastic-return mechanism (e.g., a spring), the two-stage pin lifter may incorporate various magnetic types of return mechanism, such as an electrically-operated solenoid. Further, the two-stage pin lifter may have a pneumatically-controlled return mechanism (not shown but readily understood by a skilled artisan) whereby a pneumatic inlet is included on either end of the actuator cylinder 301. Such a pneumatically-controlled return mechanism may be used with one or both of the mechanical elastic-return mechanism and/or various magnetic types of return mechanisms.

In various embodiments, the actuator cylinder 301 may comprise a pin holding shaft for the pneumatically-controlled pin 303, a welded metal bellow (not shown but readily understandable to a person of ordinary skill in the art), the return spring 305A, 305B, 305C, and one or more CDA inlet/outlet ports. In one embodiment, CDA inlet/outlet ports may be placed near both upper and lower portions of the actuator cylinder 301. In other embodiments, a single inlet/outlet port may be placed on only a side of the pneumatically-controlled pin 303 that is opposite the return spring 305 (since the return spring may be constructed to provide sufficient pressure to the return the pneumatically-controlled pin 303 to a lowermost portion of the actuator cylinder 301, i.e., a portion of the actuator cylinder 301 that is opposite the return spring 305).

In other embodiments (not shown explicitly but understandable to a person of ordinary skill in the art), the pneumatically-controlled pin 303 may use dual springs (or multiple springs) to replace or supplement the return spring 305) potentially having different compression rates in tandem, to allow high-level precision control sensitivity and robustness during a first-stage wafer lift.

In various embodiments, a three-way solenoid valve can control CDA flow to all of the pneumatically-controlled pins 303. As explained in more detail with reference to FIG. 4B, below, if a valve control signal is "on," CDA with a regulated pressure (e.g., 620±35 Pa (90±5 psig)) flows into the pneumatically-controlled pin 303 and pushes a base of the pneumatically-controlled pin 303 to reach a full stroke position (the pin "up" position). If the valve control signal is "off," the pressure inside pin lifter cylinder will be released, and the pin will return back to original position (the pin "down" position).

Each of the position sensors 307, 309, 311 may be various types of sensors known in the art. For example, the position sensors may be Hall-effect sensors or other types of analog or digital transducers known in the art (e.g., a magnetometer, a magnetoresistance-based sensor, or a reed switch). In other embodiments, the position sensors may be various types of mechanically-based switches, optical switches, or other type of switch or sensor known in the art.

As described above, a wafer de-chuck operation of embodiments of the disclosed subject matter comprises a two-stage motion. At stage one: pin up with force control enabled by continuous or periodic pressure regulation and detection of, for example, a mid-position endpoint. The stage pressure control can be a fixed value or a predetermined pressure profile on demand. In this embodiment, the mid-point position is selected to correspond to a de-chuck position of the silicon wafer 101 from the ESC 103. Consequently, the mid-position sensor 309 is used to detect a position of the pneumatically-controlled pin 303 for end-point sensing of the first-stage lift position.

The position of the mid-position sensor 309 corresponds to a height of the pneumatically-controlled pin 303 that is both below a predetermined wafer breakage threshold and above a successful wafer de-chuck threshold. For example, software embedded in the pressure control system may be used to determine the wafer breakage threshold. Such software can include a lookup table or governing equations that includes a type of semiconductor or other material (e.g., silicon, germanium, gallium-arsenide and other compound semiconductors, quartz, etc.), stress-strain curves or stress-strain equations for the material, fracture point as a function of temperature, etc.).

In various embodiments, a feedback sensor may be used to detect if the silicon wafer 101 is broken or if the de-chuck operation was successful. For example, wafer breakage would be accompanied by a sudden change in a received pressure signal (e.g., on a pressure transducer coupled to one or more of the pneumatically-controlled pins 303) that is used to supply CDA to the pneumatically-controlled pin 303. Also, the pressure signal on different ones of the pneumatically-controlled pins 303 may be different depending upon how breakage occurs. In addition to or instead of the pressure transducer, other types of sensors known in the art may be used as a substrate-breakage detector to detect wafer breakage (e.g., one or more signals from a laser reflectometer, an ultrasonic sensor, an optical camera, etc.). A detected broken wafer signal or a failed de-chuck may be accompanied by a post-fault detection alarm (or other annunciator, such as a signal on a graphical user interface (GUI) or a flashing light). Each of the other sensors may also be incorporated to provide additional feedback on a position of the silicon wafer 101.

At stage two: a regular pin "up" motion may be performed at a higher speed (since the silicon wafer 101 has already "separated" from the ESC 103). The second stage, in this embodiment, moves the silicon wafer 101 to a position high enough such that a robotic end-effector can be placed under the wafer. The higher speed allows for high wafer throughput.

Figure 4A:
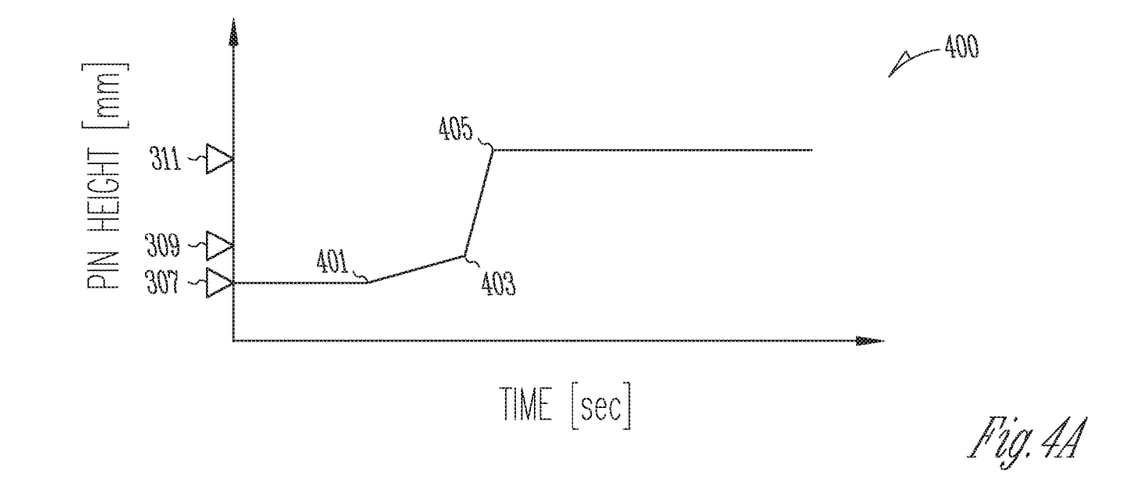
FIG. 4A shows an exemplary graph of pin height as a function of time for three different, pin-height levels.

With concurrent reference to FIG. 3, FIG. 4A shows an exemplary graph 400 of pin height as a function of time for three different pin-height levels. For example, at time "0," the lowered-position sensor 307 indicates that the pneumatically-controlled pin 303 is the "down" position. Therefore, the silicon wafer 101 is in contact or near contact with the uppermost surface of the ESC 103 (see FIG. 1A).

At a time corresponding to a first point 401 on the graph 400, a first control signal is sent to a proportional valve controller or other pressure controller (not shown but understandable to a person of ordinary skill in the art) to increase the pressure to the actuator cylinder 301, thereby increasing the position of the pneumatically-controlled pin 303 to a mid-level position as indicated by the mid-position sensor 309, once the pneumatically-controlled pin 303, and consequently the silicon wafer 101, reaches the mid-point position.

At a time corresponding to a second point 403 on the graph, a second control signal is sent to the proportional valve controller or other pressure controller to increase the pressure to the actuator cylinder 301, thereby increasing the position of the pneumatically-controlled pin 303 to a raised-level position, once the pneumatically-controlled pin 303, and consequently the silicon wafer 101, reaches the raised position. A person of ordinary skill in the art will recognize that each of the first control signal and the second control signal may be identical or similar signals to control the proportional valve controller or the pressure controller.

At a time corresponding to a third point 405 on the graph, the actuator cylinder 301 has increased to the raised-level position as indicated by the raised-position sensor 311. At the third point 405 on the graph 400, the pneumatically-controlled pin 303 and the silicon wafer 101 are maintained at the raised position until the robotic arm removes the silicon wafer 101 from the process chamber. Then, an additional signal (not indicated on the graph 400) is applied to the proportional valve controller or other pressure controller to lower the pressure applied to the actuator cylinder 301, and consequently to the pneumatically-controlled pin 303, to once again return the pneumatically-controlled pin 303 to the lowered position after a subsequent insertion of another silicon wafer.

Figure 4B:
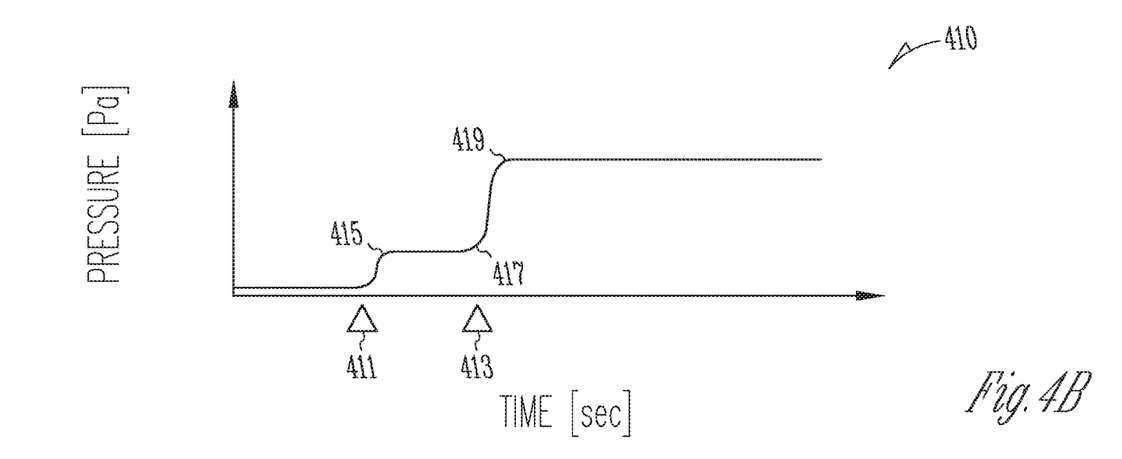
FIG. 4B shows an exemplary graph of pressure applied to a pin within an actuator as a function of time.

With continuing reference to FIG. 4A, FIG. 4B shows an exemplary graph 410 of pressure applied to a pin within an actuator as a function of time. At time "0," pressure is low enough (e.g., at 0 Pa) such that the pneumatically-controlled pin 303 remains at the lowered position. At a selected time, a first command signal 411 is sent to the proportional valve controller or other pressure controller. The first command signal 411 increases pressure applied to the pneumatically-controlled pin 303 until the pressure increases to a first pressure-level 415, corresponding to a first time, thereby raising the pneumatically-controlled pin 303 to the midpoint position as indicated by the mid-position 310 of FIG. 3.

The pressure is maintained at a pressure level 417, corresponding to a second time (presumably after the silicon wafer 101 is separated from the ESC 103), on the pneumatically-controlled pin 303 until a second command signal 413 is sent to the proportional valve controller or other pressure controller. The second command signal 413 increases pressure applied to the pneumatically-controlled pin 303 until the pressure increases to a second pressure-level 419, corresponding to a third time, thereby raising the pneumatically-controlled pin 303 to the raised-point position as indicated by the raised-position 330 of FIG. 3.

As is known to a person of ordinary skill in the art, a proportional-valve controller or other type of pressure controller can be selected to provide a fast response time in order to control the pneumatically-controlled pin 303 substantially in real-time to continuously regulate and control a pressure applied to each of the pneumatically-controlled pins 303 during a wafer de-chucking operation. Consequently, an amount of force applied to the silicon wafer 101 is controlled by continuously (or periodically at pre-selected time intervals) regulating an inlet pressure applied to the actuator cylinder 301, and consequently, the pressure applied to the pneumatically-controlled pin 303.

The pre-selected time intervals can be based upon a velocity of the pneumatically-controlled pin 303. For example, if the pin is determined to raise (or fall) at a certain velocity, the pressure can be monitored at pre-determined time intervals (e.g., perhaps every 30 msec). Therefore, the disclosed subject matter can provide for either substantially-real-time or periodic monitoring and can provide a force feedback control by techniques known in the art.

In one specific exemplary embodiment, and with continued reference to FIGS. 4A and 4B, each of the position sensors 307, 309, 311 are detected as endpoint signals— thus, a "down," a "middle," or an "up" position, respectively, are sensed. The accompanying received signals and a pressure setpoint for each of these positions for this specific embodiment are shown below with reference to Table I.

TABLE 1

| Lifter Position Command | Endpoint sensor | | | Pressure Setpoint [Pascal (psig)] |
|---|---|---|---|---|
| Up | 0 | 0 | 1 | 621 (90) |
| Middle | 0 | 1 | 0 | 207 (30) |
| Down | 1 | 0 | 0 | 0 (0) |

In a specific exemplary embodiment, three of the two-stage pin lifter mechanisms are used to raise the silicon wafer 101 above the ESC 103. In this embodiment, the three two-stage pin lifter mechanisms may be placed, for example, approximately about midway between a center position (as measured when the silicon wafer 101 is first placed on the ESC 103, thereby corresponding with an approximate center-position of an uppermost surface of the ESC 103 as well), with each of the two-stage pin lifter mechanisms placed approximately 120° away from one another along substantially the same radius from the center of the silicon wafer 101.

In other embodiments, each of the two-stage pin lifter mechanisms is coupled to a common pressure controller. However, each of the two-stage pin lifter mechanisms is monitored through the mid-position sensor 309. In this embodiment, the pressure supplies CDA to the pneumatically-controlled pins 303, in which the pressure can be stopped or reduced until each of the pneumatically-controlled pins 303 is in the same or substantially the same mid-point position as indicated by respective ones of the mid-position sensors 309. If each of the pneumatically-controlled pins 303 is not indicated by the mid-position sensor 309 to be in the same or substantially the same position within a pre-determined time period, an alarm or other annunciator can signal an operator that additional corrective measures may need to be performed.

In one embodiment, each of the two-stage pin lifter mechanisms is pneumatically-controlled independently of each other. Consequently, if each pneumatically-controlled pin 303 in each of the three two-stage pin lifter mechanisms is at a different height, as sensed by one of the position sensors 307, 309, 311 on each of the three pins, then additional pneumatic pressure may be applied to only a selected one of the pneumatically-controlled pins 303 that is at a different height. For example, if two of three pneumatically-controlled pins have reached a middle position as detected by respective ones of the mid-position sensor 309 (thereby resulting in a tilted wafer and/or indicating a sticking pin), additional pressure (e.g., active compensation of the pressure controllers) may be applied to the third pneumatically-controlled pin 303 to move the silicon wafer 101 to the proper de-chuck height. In such an embodiment, the amount of pressure supplied could be predetermined to avoid wafer breakage as discussed above.

Based on upon reading and understanding the disclosure provided herein, a person of ordinary skill in the art will recognize that other types of mechanisms may be used to control each of the pneumatically-controlled pins 303. For example, various types of electrically-controlled linear actuators or other types of linear actuators (e.g., thereby comprising linearly-actuated pins), or even hydraulically-controlled actuators may be used in place of, or in conjunction with, the pneumatically-controlled pin 303. Further, depending on the type of substrate that is to be lifted, pin lifter mechanisms having more than two-stages may be utilized. For example, a multi-stage pin lifter mechanism may be used for extremely delicate or extremely brittle substrates. However, upon reading and understanding the disclosure provided herein, a person of ordinary skill in the art will recognize how to construct such multi-stage pin lifter mechanisms based on this disclosure.

Figure 5A:
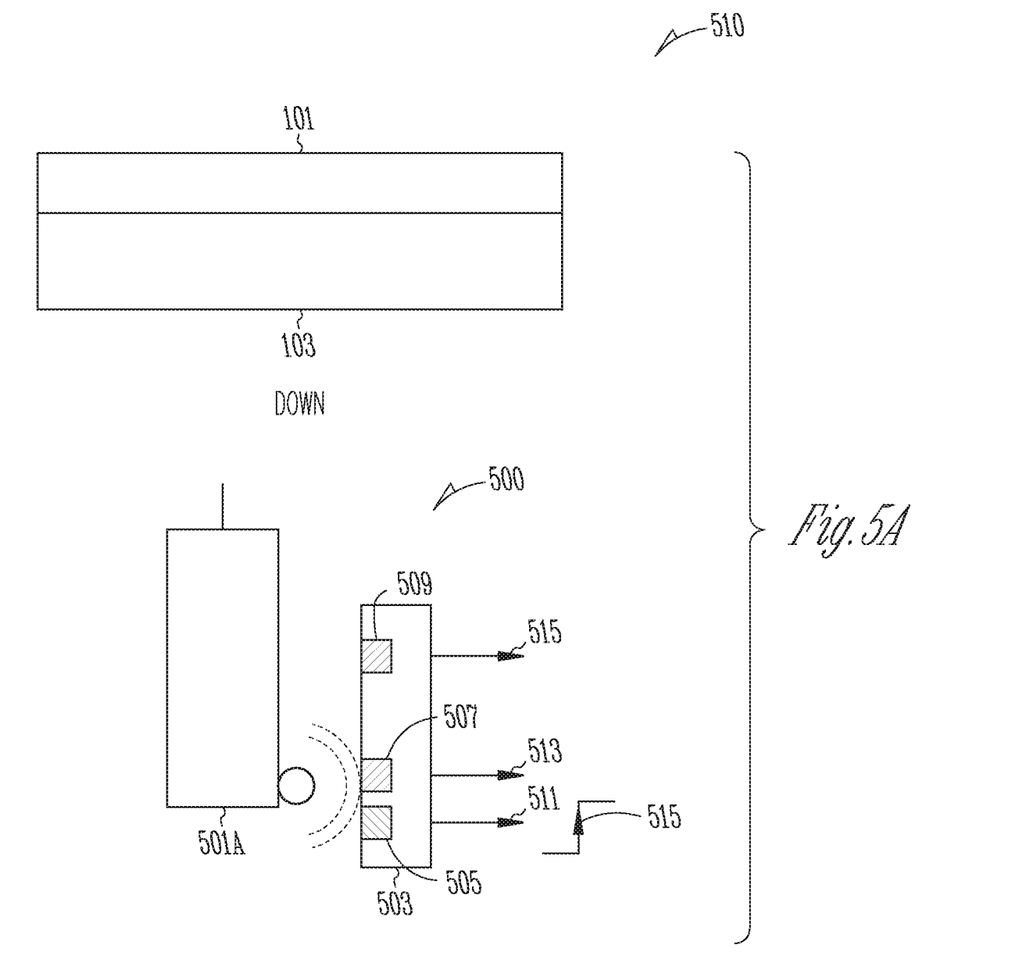
FIGS. 5A-5C show additional exemplary embodiments of a two-stage lift logic for an actuator pin in accordance with the additional embodiments of the disclosed subject matter.
Figure 5B:
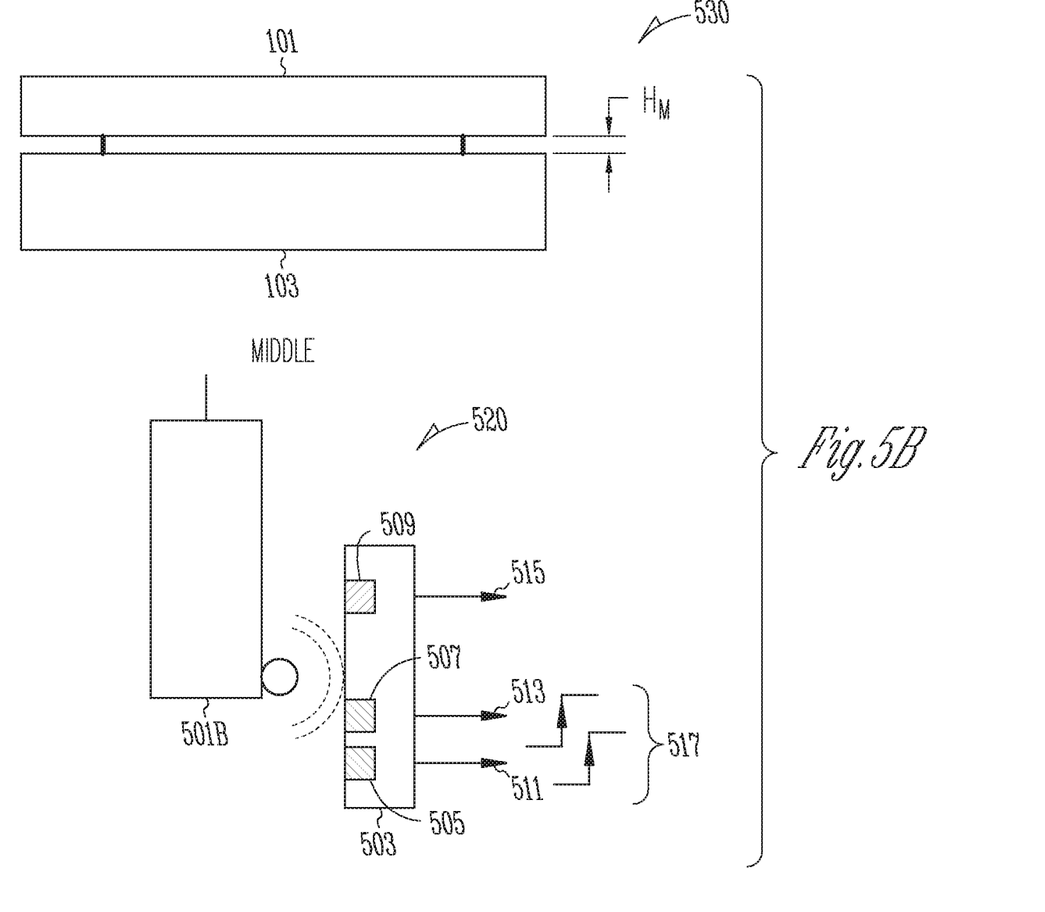
Figure 5C:
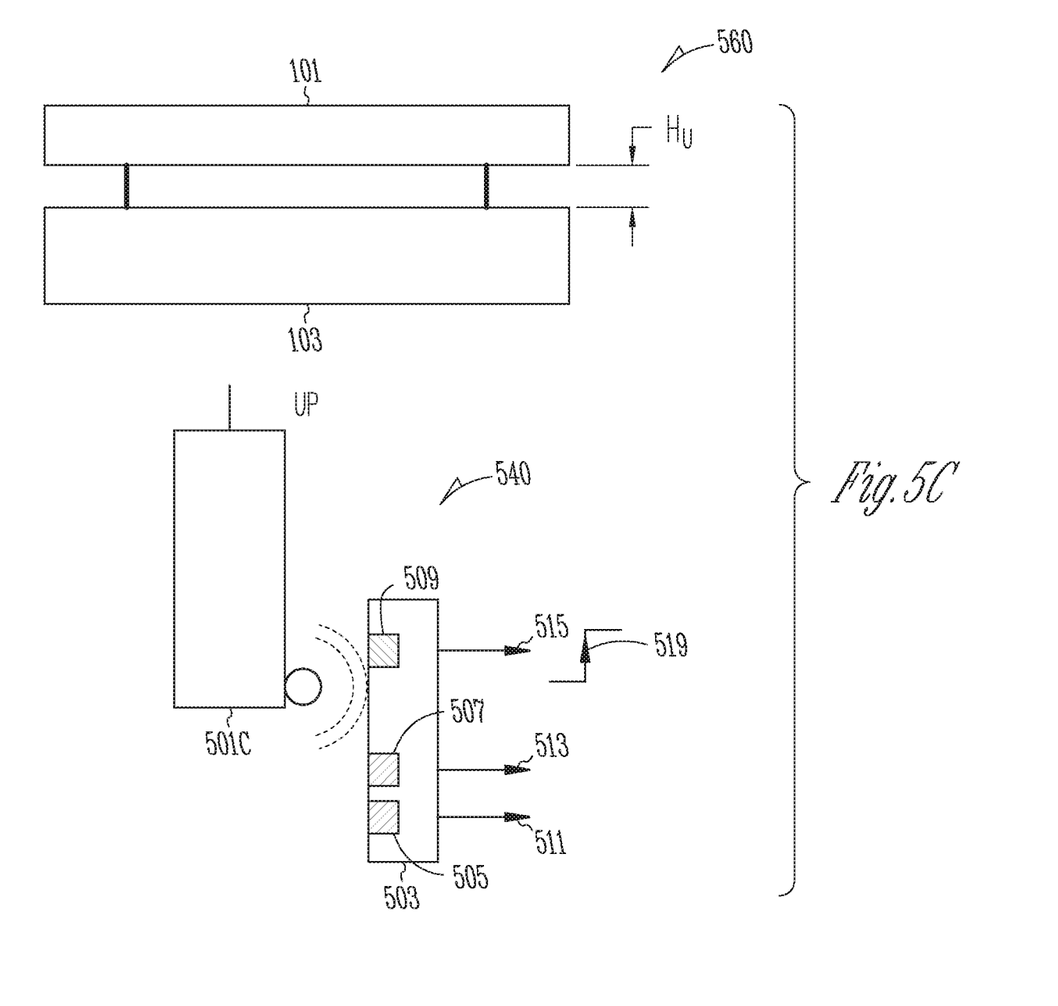

With reference now to FIGS. 5A-5C additional exemplary embodiments of a two-stage lift logic for an actuator pin in accordance with the disclosed subject matter are shown and described. FIG. 5A is shown to include a substrate and substrate holder combination 510 showing the substrate in contact or near contact with the substrate holder. In an embodiment, the substrate and substrate holder combination 510 comprises a silicon wafer 101 in contact or near contact with an ESC 103. Thus, the silicon wafer 101 is at the down position with relation to the ESC 103.

Lift-position sensor logic assembly 500 is shown to include multiple true-position sensors including a lowered-position sensor 505, a mid-position sensor 507, and a raised-position sensor 509, all mounted in an optional sensor mounting apparatus 503. The true-position sensors each have a respective output channel 511, 513, 515, and indicate a true position of a pin-lifter mechanism, rather than an endpoint detection as discussed above with reference to FIG. 3. In this way, a true position of a pin-lifter mechanism, such as a true position of the pneumatically-controlled pin 303 of FIG. 3, may be determined. By knowing a true position of the pin-lifter mechanism, a more accurate determination of a position of the silicon wafer 101 is also known (as opposed to simply when the silicon wafer 101 reaches an endpoint location).

For example, in FIG. 5A, a pin-lifter mechanism 501A is in a lowered or "down" position. The lowered position is sensed by the lowered-position sensor 505 that provides an output signal 512 from the respective output channel 511. As will be recognizable to a person of ordinary skill in the art, upon reading and understanding the disclosure provided herein, the output signal 512 may be transmitted or otherwise coupled to a control system (e.g., a microprocessor, an application-specific integrated circuit (ASIC), a field-programmable gate array (FPGA), a finite-state machine (FSM), or other type or types of controller device known in the art). By knowing the true position of the silicon wafer 101, the pressure delivered to the pin-lifter mechanism may be controlled precisely.

FIG. 5B is shown to include a substrate and substrate holder combination 530 showing the substrate near or at a de-chuck position (a middle position) with the pin-lifter mechanism 501E having raised the silicon wafer 101 a distance $H_M$ (indicating a mid-position height). For example, as the silicon wafer 101 approaches the de-chuck position, a combined signal 517, based on an output from output channels 511, 513 of the lowered-position sensor 505 and the mid-position sensor 507, respectively, is sent to the control system from the lift-position sensor logic assembly 520.

Based on sensing an approach to the de-chuck position, the pressure delivered to the pin may be varied through a control feedback loop (e.g., through a proportional-integral-derivative controller (PID) or other control mechanism known in the art) to approach the de-chuck point more slowly. Consequently, the silicon wafer 101 may be raised quickly from the lowered position until the mid-position sensor 507 senses that the wafer is approaching a position whereby the wafer is ready to de-chuck from the ESC 103. At that point, a velocity of the lift pin decreases to avoid potential wafer breakage. However, because of the initial higher velocity of the silicon wafer 101, an overall throughput of wafers through a processing system (or other system) may be increased.

Once one of the various types of sensors described herein indicate that the silicon wafer 101 has successfully de-chucked from the ESC 103, the silicon wafer 101 may be raised quickly to a fully-raised position as indicated by a substrate and substrate holder combination 560 of FIG. 5C, with the silicon wafer 101 now at a height $H_U$ (indicating an upper or raised-position height above the ESC 103). The lift-position sensor logic assembly 540 now sends a signal 519, based on an output from output channel 515 from the raised position sensor 509, to the control system from the lift-position sensor logic assembly 540 to indicate that the silicon wafer 101 is now in the fully-raised position and may be removed from the process chamber by the end-effector of the robotic arm.

In addition to the various embodiments described herein, a full-range position sensor (not shown explicitly but known to a person of ordinary skill in the art), can replace or supplement various ones of the position sensors described herein (e.g., the position sensors 307, 309, 311, 505, 507, 509) to provide full-range wafer position feedback in substantially real time. In other embodiments, only the mid-position sensor 309, 507 is used—the lowered-position sensor 307, 505 and the raised-position sensor 311, 509 are then optional.

Various embodiments of a two-stage pin lifter mechanism described herein can solve the aforementioned problems such as wafer breakage based on an unsuccessful wafer de-chuck operation. One or more of the various embodiments can also reduce or minimize DA offset problems. As described herein with regard to, for example, FIGS. 3 and 5A through 5C, the disclosed subject matter may comprise, in various embodiments, three two-stage pin lifter mechanisms. In various embodiments, the two-stage pin lifter mechanisms may be independently-controlled. The two-stage pin lifter mechanisms may be controlled by, for example, various types of pneumatically-controlled actuators or other types of actuators described herein and known in the art. Therefore, the various embodiments provide for an extremely reliable and low-cost pin lifter mechanism that is substantially maintenance free. The disclosed subject matter is compatible with various types of semiconductor process tools including dielectric-etch and conductor-etch process tools. The disclosed subject matter is also compatible with various types of semiconductor metrology tools that use various types of substrate-holding mechanisms to hold and position substrates.

Overall, the disclosed subject matter contained herein describes or relates generally to operations of "tools" in a semiconductor fabrication environment (fab). Such tools can include various types of deposition (including plasma-based tools such as ALD (atomic layer deposition), CVD (chemical vapor deposition), PECVD (plasma-enhanced CVD), etc.) and etching tools (e.g., reactive-ion etching (RIE) tools), as well as various types of thermal furnaces (e.g., such as rapid thermal annealing and oxidation), ion implantation, and a variety of other process and metrology tools found in various fabs and known to a person of ordinary skill in the art. However, the disclosed subject matter is not limited to semiconductor environments and can be used in a number of machine-tool environments such as robotic assembly, manufacturing, and machining environments.

Upon reading and understanding the disclosure provided herein, a person of ordinary skill in the art will recognize that various embodiments of the disclosed subject matter may be used with other types of substrate-holding devices, in addition to an ESC. For example, various types of cleaning, metrology, and process tools used in the semiconductor and allied industries use, for example, vacuum-controlled substrate-holding devices. For example, various types of substrate-holding devices may have problems with substrate sticking or otherwise adhering to the substrate-holding devices due to forces such as molecular adhesion, Van der Waal forces, electrostatic forces, and other near-field contact forces.

Therefore, as described, various embodiments of the disclosed subject matter provide for a pin lifter mechanism that maintains both a high level of precision and a high level of accuracy for, for example, wafer chucking and de-chucking operations.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A substrate lift-mechanism, comprising:
   a plurality of pins configured to position a substrate above a substrate-holding device, each of the plurality of pins comprising a single, pneumatically-controlled pin with each of the plurality of pins being contained within a respective single actuator cylinder; and
   a plurality of mid-position sensors each respectively coupled to a corresponding pin, each of the plurality of mid-position sensors is configured to monitor a mid-point position of the corresponding pin between a maximum position and a minimum position;
   the mid-point position of the corresponding pin being indicative of being proximate a de-chuck position of the substrate, a respective one of the plurality of mid-position sensors to generate a signal when proximate to the de-chuck position of the substrate, the signal to be transmitted to a control system to control an operation of the corresponding pin based on being proximate to the de-chuck position, the control system is further configured to vary a setpoint pressure sent to each of the plurality of pins from a setpoint pressure applied when the pins are in a down position.

2. The substrate lift-mechanism of claim 1, further comprising a substrate-breakage detector.

3. The substrate lift-mechanism of claim 1, wherein the mid-position sensor is configured to monitor the mid-point position to determine whether the substrate is at the de-chuck position from the substrate-holding device.

4. The substrate lift-mechanism of claim 1, Therein the substrate-holding device is an electrostatic chuck (ESC).

5. The substrate lift-mechanism of claim 4, wherein the mid-position sensor is configured to monitor the mid-point position to determine when the substrate is de-chucked from the ESC.

6. The substrate lift-mechanism of claim 1, wherein the plurality of pins comprises at least three pins.

7. The substrate lift-mechanism of claim 1, further comprising a plurality of lowered-position sensors each respectively coupled to the corresponding pin, wherein each lowered-position sensor is configured to monitor when the substrate is in one of a lowered position and the down position, thereby indicating that the substrate is in direct contact, the down position, or near contact, the lowered position, with the substrate-holding device.

8. The substrate lift-mechanism of claim 1, wherein each of the plurality of pins is configured to be coupled independently to a pressure-control device.

9. The substrate lift-mechanism of claim 1, wherein at least one of the plurality of mid-position sensors is a true-position sensor.

10. The substrate lift-mechanism of claim 1, wherein at least one of the plurality of mid-position sensors is a full-range position sensor.

11. The substrate lift-mechanism of claim 1, wherein a velocity of at least one of the plurality of pins is decreased upon approaching the mid-point position.

12. The substrate lift-mechanism of claim 1, wherein a velocity of the plurality of pins is increased upon detection of reaching the mid-point position to achieve the maximum position.

13. The substrate lift-mechanism of claim 1, wherein the plurality of pins comprises linearly-actuated pins.

14. A wafer lift-mechanism, comprising:
  a plurality of two-stage lift pins configured to position a wafer above an electrostatic chuck (ESC), each of the plurality of lift pins comprising a single, pneumatically-controlled pin with each of the plurality of pins being contained within a respective single actuator cylinder and being configured to be controlled independently from one another; and
  a plurality of mid-position sensors each respectively coupled to a corresponding lift pin, each mid-position sensor being configured to monitor a mid-point position to determine whether the wafer is at or near a de-chuck position relative to the ESC in a de-chuck operation;
  the mid-point position of the corresponding pin being indicative of being proximate the de-chuck position of the wafer, a respective one of the plurality of mid-position sensors to generate a signal when proximate to the de-chuck position of the wafer, the signal to be transmitted to a control system to control an operation of the corresponding pin based on being proximate to the de-chuck position, the control system is further configured to vary a setpoint pressure sent to each of the plurality of pins from a setpoint pressure applied when the pins are in a down position.

15. The wafer lift-mechanism of claim 14, further comprising:
  a lowered-position sensor configured to indicate when the wafer is in one of a lowered position and the down position, thereby indicating that the wafer is in direct contact, the down position, or near contact, the lowered position, with the ESC; and
  a raised-position sensor configured to indicate when the wafer is in a fully-raised position.

16. The wafer lift-mechanism of claim 14, wherein the mid-position sensor is a full-range position sensor.

17. The wafer lift-mechanism of claim 14, wherein a velocity of at least one of the plurality of two-stage lift pins is decreased upon approaching the mid-point position.

18. The wafer lift-mechanism of claim 14, wherein a velocity of the plurality of two-stage lift pins is increased upon detection of reaching the mid-point position to achieve a maximum position.

19. The wafer lift-mechanism of claim 14, wherein the plurality of two-stage lift pins comprises linearly-actuated pins.

* * * * *